United States Patent
Lin et al.

(10) Patent No.: US 8,264,288 B2
(45) Date of Patent: Sep. 11, 2012

(54) QUADRATURE VOLTAGE CONTROLLED OSCILLATOR INCLUDING TRANSMISSION LINE

(75) Inventors: Yu-Ling Lin, Taipei (TW); Ying-Ta Lu, Fanlu Township (TW); Hsiao-Tsung Yen, Tainan (TW); Ho-Hsiang Chen, Hsin-Chu (TW); Chewn-Pu Jou, Hsin-Chu (TW); Fu-Lung Hsueh, Cranbury, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 12/957,040

(22) Filed: Nov. 30, 2010

(65) Prior Publication Data

US 2012/0133446 A1  May 31, 2012

(51) Int. Cl.
*H03L 1/00* (2006.01)
(52) U.S. Cl. ............... 331/107 SL; 331/167; 331/116 R; 331/116 FE; 331/2; 331/46
(58) Field of Classification Search .................. 331/167, 331/107 SL, 2, 46
See application file for complete search history.

(56) References Cited

U.S. PATENT DOCUMENTS 6,911,870 B2    6/2005 Gierkink et al.

OTHER PUBLICATIONS

Andreani, P., et al., "On the Phase-Noise and Phase-Error Performances of Multiphase LC CMOS VCOs," IEEE Journal of Solid-State Circuits, vol. 39, No. 11, Nov. 2004, pp. 1883-1893.
Cabanillas, J., et al., "A 900 MHz Low Phase Noise CMOS Quadrature Oscillator," IEEE Radio Frequency Intergrated Circuits Symposium, 2002, pp. 63-66.
Hong, J-P., et al., "A 2.2 mW Backgate Coupled LC Quadrature VCO with Current Reused Structure," IEEE Microwave and Wireless Components Letters, 2006, pp. 1-3.
Kim, C-H., et al., "A Low Phase Noise and Low Power Series Coupled Quadrature VCO Using Reconfigurable LC Tank," RWS, IEEE, 2008, pp. 395-398.

*Primary Examiner* — Arnold Kinkead
(74) *Attorney, Agent, or Firm* — Slater & Matsil, L.L.P.

(57) ABSTRACT

A circuit includes an oscillator circuit including a first oscillator and a second oscillator. The first and the second oscillators are configured to generate signal having a same frequency and different phases. A transmission line is coupled between the first and the second oscillators.

14 Claims, 5 Drawing Sheets

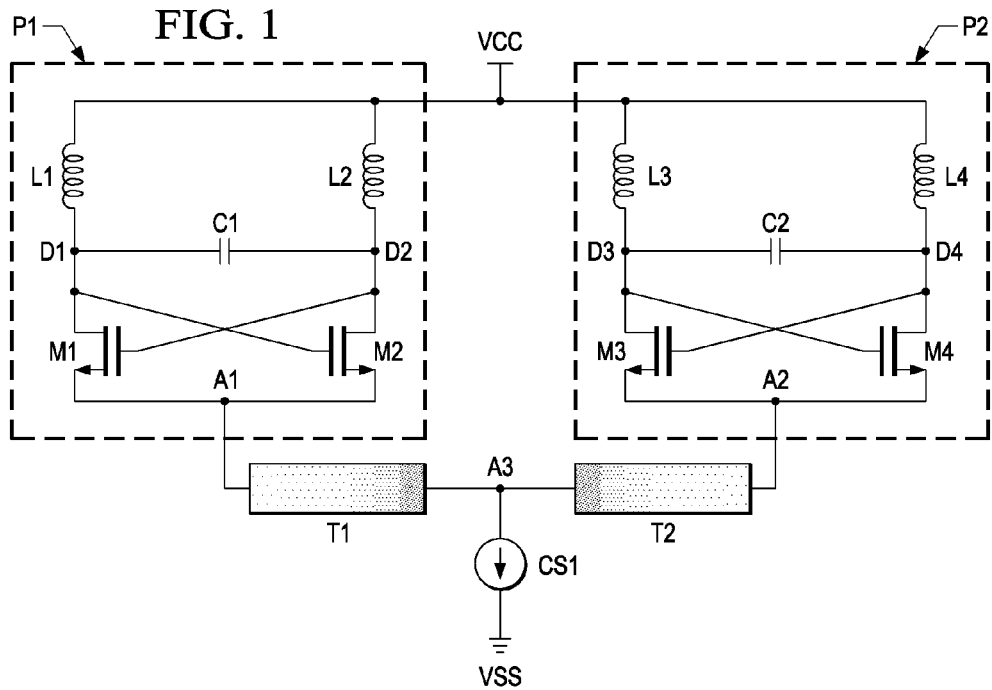
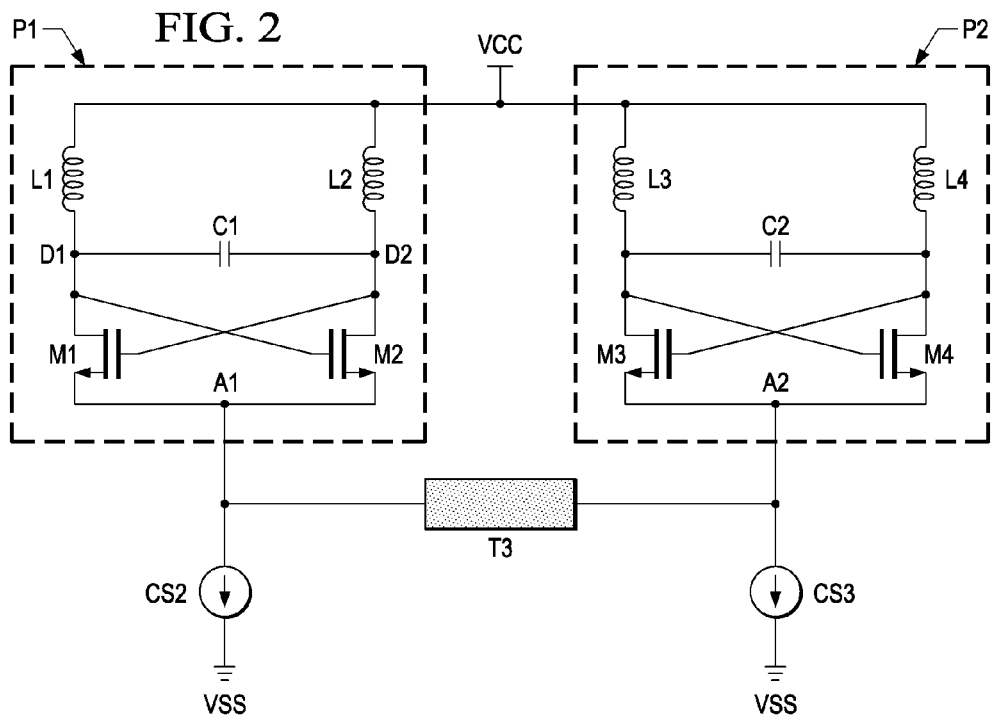

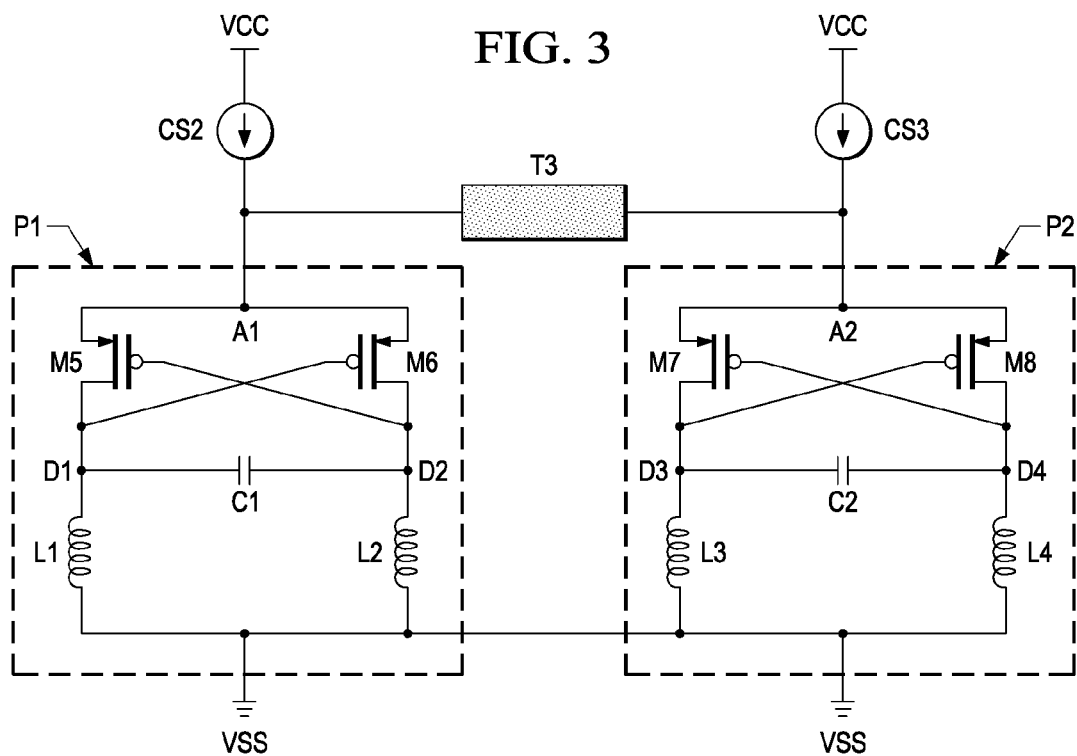
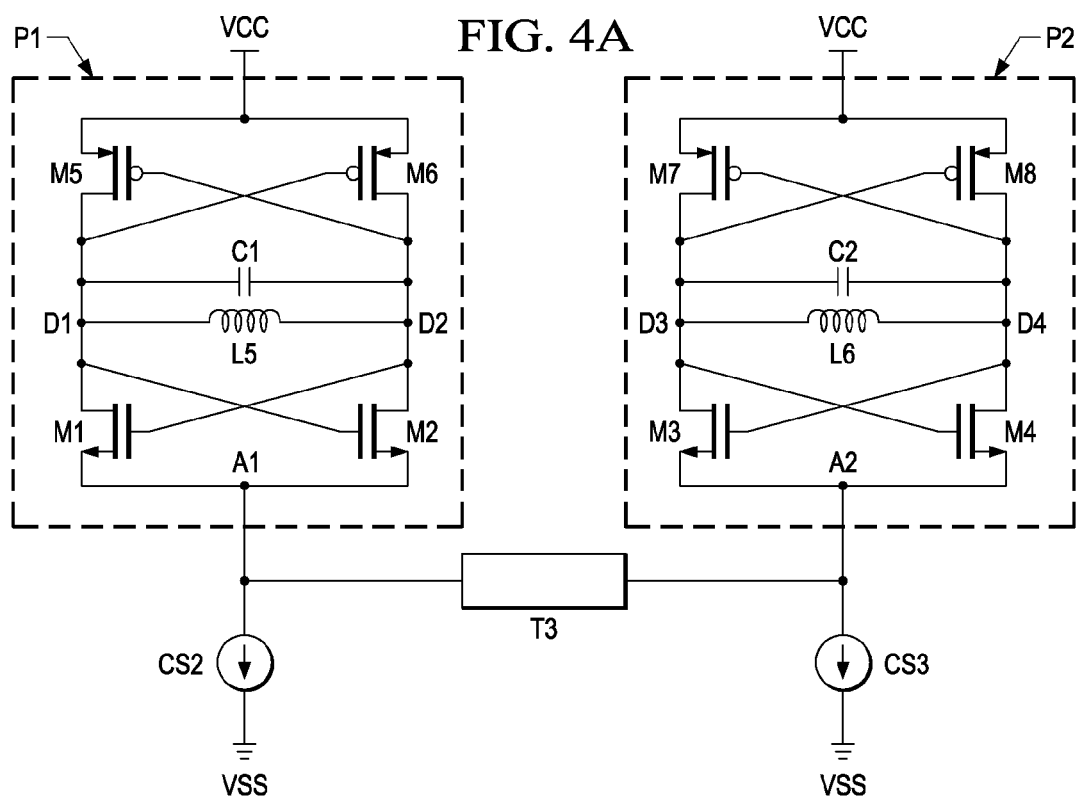

QUADRATURE VOLTAGE CONTROLLED OSCILLATOR INCLUDING TRANSMISSION LINE

BACKGROUND

The needs of wireless communication have increased dramatically in the last few years. In the meantime, higher data rates are also demanded increasingly. Since the amount of available radio-frequency (RF) spectrum is limited, telecommunication equipment manufacturers are seeking ways to increase the spectral efficiency by using more complex modulation schemes and/or to utilizing available bandwidth at higher RF frequencies.

One of the methods of solving the above-mentioned problems is to use quadrature signals, which have become essential elements in low intermediate frequency (IF) transceivers for today's wireless communication systems. The quadrature signals are typically generated by quadrature voltage controlled oscillator (QVCO) circuits. The quadrature signals allow for quadrature amplitude modulation (QAM), which permits significantly more information to be carried by a particular bandwidth than other modulation schemes such as amplitude modulation (AM) and phase modulation (PM).

There were various types of QVCO circuits. Conventional QVCO circuits, however, often require extra active devices that introduce additional phase noise into the QVCO circuits. In addition, conventional QVCO circuits often suffer from high power consumption, voltage headroom dissipation, and LC resonant frequency effects.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a quadrature voltage controlled oscillator (QVCO) circuit in accordance with an embodiment, wherein a transmission line is coupled between $2^{nd}$ harmonic nodes;

FIG. 2 illustrates a QVCO circuit in accordance with an alternative embodiment, wherein two transmission lines are serially coupled between $2^{nd}$ harmonic nodes;

FIG. 3 illustrates a QVCO circuit in accordance with an alternative embodiment, wherein current sources are connected to the side closer to VCC node than to VSS node, and wherein cross-coupled PMOS transistors are used;

FIG. 4A illustrates a QVCO circuit in accordance with an alternative embodiment, wherein cross-coupled complementary MOS transistors are used, and wherein a transmission line is connected to the side closer to VSS node than to VCC node;

DETAILED DESCRIPTION OF ILLUSTRATIVE EMBODIMENTS

Figure 4B:
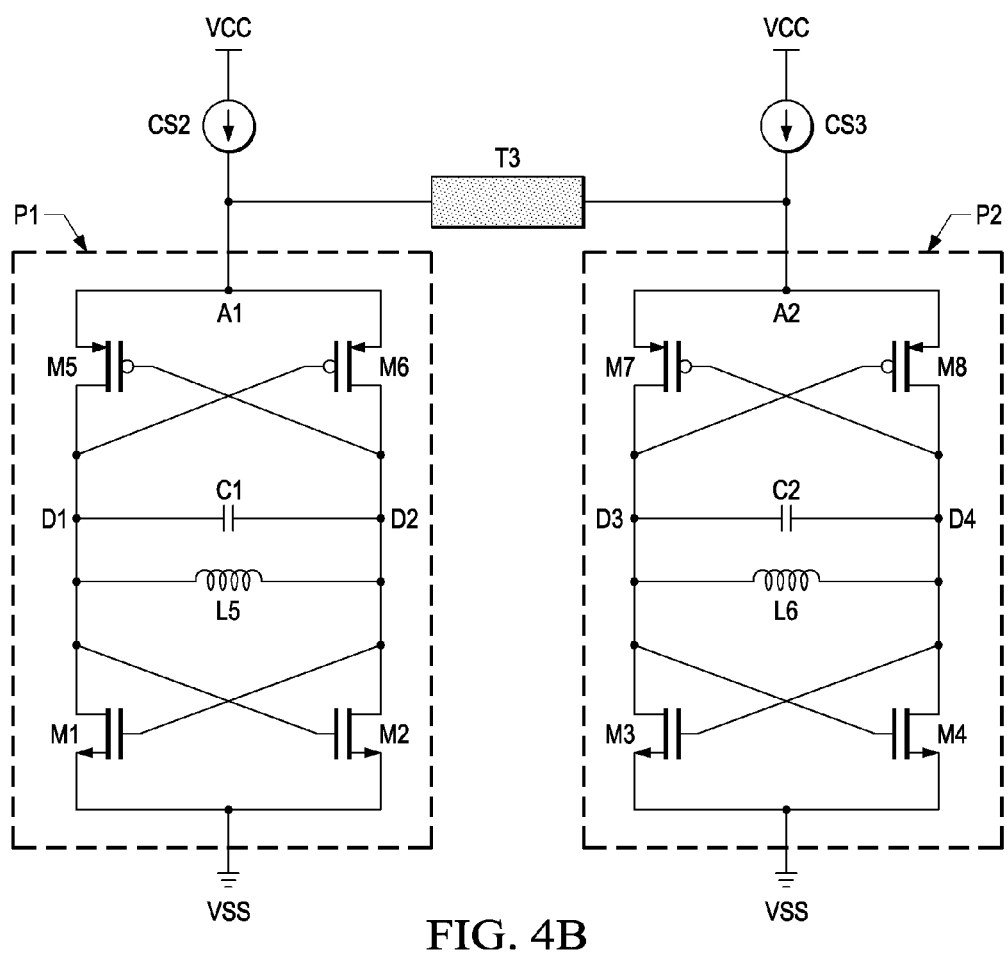
FIG. 4B illustrates a QVCO circuit in accordance with an alternative embodiment, wherein cross-coupled complementary MOS transistors are used, and wherein a transmission line is connected to the side closer to VCC node than to VSS node.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel quadrature voltage controlled oscillator (QVCO) circuit comprising a transmission line is provided in accordance with an embodiment. The variations and the operation of the embodiment are discussed. Throughout the various views and illustrative embodiments, like reference numbers are used to designate like elements.

FIG. 1 illustrates a circuit diagram of a QVCO circuit in accordance with an embodiment. The QVCO circuit includes first oscillator portion P1 and second oscillator portion P2, both coupled between positive power supply node VCC and node VSS. First oscillator portion P1 and second oscillator portion P2 may be identical to each other. Each of oscillator portions P1 and P2 is also an oscillator. A positive power supply voltage VCC is provided to positive power supply node VCC in order to drive the QVCO circuit. Node VSS may be an electrical ground.

First oscillator portion P1 includes inductors L1 and L2, and capacitor C1, which may be a variable capacitance capacitor (varactor). Inductors L1 and L2 are connected to positive power supply node VCC. Each of the two ends (capacitor plates) of capacitor C1 is connected to an end of one of inductors L1 and L2. NMOS transistors M1 and M2 are cross-coupled to each other. The drains of NMOS transistors M1 and M2 are connected to the opposite ends of capacitor C1. The gate of transistor M1 is connected to the drain of transistor M2, and the gate of transistor M2 is connected to the drain of transistor M1. The sources of NMOS transistors M1 and M2 are connected to $2^{nd}$ harmonic node A1. Throughout the description, $2^{nd}$ harmonic nodes A1 and A2 are also referred to as harmonic nodes.

Similar to the first oscillator portion P1, second oscillator portion P2 includes inductors L3 and L4, and capacitor C2, which may be a varactor. Inductors L3 and L4 are connected to positive power supply node VCC. Each of the two ends of capacitor C1 is connected to an end of one of inductors L3 and L4. NMOS transistors M3 and M4 are cross-coupled to each other. The drains of NMOS transistors M3 and M4 are connected to the opposite ends of capacitor C2. The gate of transistor M3 is connected to the drain of transistor M4, and the gate of transistor M4 is connected to the drain of transistor M3. The sources of NMOS transistors M3 and M4 are connected to $2^{nd}$ harmonic node A2. In an embodiment, inductors L1, L2, L3, and L4 have the same inductance, and capacitors C1 and C2 have the same capacitance.

Oscillator portions P1 and P2 are operated to generate signals clk1, clk2, clk3, and clk4 (not shown in FIG. 1, please refer to signals 40, 42, 44, and 46, respectively) on nodes D1, D2, D3, and D4, respectively. Signals clk1, clk2, clk3, and clk4 have the same frequency f0. The respective angular frequency of signals clk1, clk2, clk3, and clk4 is ω0, which is equal to $2\pi f0$. If the phase of signal clk1 is used as a reference, then the phases of signals clk2, clk3, and clk4 are behind the phase of signal clk1 by 90 degrees, 180 degrees, and 270 degrees, respectively, Accordingly, signals clk1, clk2, clk3, and clk4 are referred to as quadrature signals, and nodes D1, D2, D3, and D4 are referred to as quadrature nodes throughout the description. On the other hand, the signals on $2^{nd}$ harmonic nodes A1 and A2 have a frequency equal to 2f0. As a result, the angular frequency of the $2^{nd}$ harmonic signals on $2^{nd}$ harmonic nodes A1 and A2 is equal to $2\omega0$, or $4\pi f0$.

To ensure that the phases of signals clk2, clk3, and clk4 are behind the phase of signal clk1 by 90 degrees, 180 degrees, and 270 degrees, respectively, the signals on $2^{nd}$ harmonic nodes A1 and A2 need to be accurate differential signals, which means that the phases of the $2^{nd}$ harmonic signals on $2^{nd}$ harmonic nodes A1 and A2 have a phase difference of 180 degrees. In an embodiment, transmission lines T1 and T2 are connected between $2^{nd}$ harmonic nodes A1 and A2, and are connected in series. The intermediate node A3 of transmission lines T1 and T2 is coupled to node VSS through current source CS1, which provides the bias current to first oscillator portion P1 and second oscillator portion P2. Current source CS1 may be implemented using an NMOS transistor (not shown), for example.

Each of transmission lines T1 and T2 may have a length equal to $\lambda/4$, wherein $\lambda$ equals $C/(2f0)$, with C being the speed of light. Alternatively stating, the length of each of transmission lines T1 and T2 may be equal to one fourth of the wavelength of the $2^{nd}$ harmonic signals, which are the signals generated on $2^{nd}$ harmonic nodes A1 and A2. Accordingly, the total length of transmission lines T1 and T2 is equal to $\lambda/2$. With transmission lines T1 and T2 having the total length of $\lambda/2$, the phases of $2^{nd}$ harmonic signals on second harmonic nodes A1 and A2 may be maintained to have a 180 degree difference, and hence the $2^{nd}$ harmonic signals are differential signals.

FIG. 2 illustrates a circuit diagram of a QVCO circuit in accordance with an alternative embodiment. First oscillator portion P1 and second oscillator portion P2 in this embodiments may be essentially the same as in the embodiment shown in FIG. 1. The QVCO circuit in this embodiment includes transmission line T3, which has a length equal to $\lambda/2$, wherein wavelength $\lambda$ is essentially the same as in the embodiment shown in FIG. 1, and is the wavelength of the signals on $2^{nd}$ harmonic nodes A1 and A2. The two ends of transmission line T3 are connected to $2^{nd}$ harmonic nodes A1 and A2. Furthermore, current sources CS2 and CS3 connect $2^{nd}$ harmonic nodes A1 and A2, respectively, to node VSS. Current sources CS2 and CS3 are used to provide bias currents to first portion P1 and second portion P2, respectively, and may be implemented using NMOS transistors, for example. Current sources CS2 and CS3 provide the same current, and can be implemented using identical MOS transistors. Similarly, with transmission line T3 having a length equal to $\lambda/2$, the phases of $2^{nd}$ harmonic signals on $2^{nd}$ harmonic nodes A1 and A2 may be maintained to have a 180 degree difference. On the other hand, with first portion P1 and second portion P2 being identical, the $2^{nd}$ harmonic signals on $2^{nd}$ harmonic nodes A1 and A2 have the same frequency.

FIG. 3 illustrates a QVCO circuit in accordance with an alternative embodiment. This embodiment is similar to the embodiment shown in FIG. 1, except that PMOS transistors M5, M6, M7 and M8, rather than NMOS transistors are used, wherein PMOS transistors M5 and M6 are used in first oscillator portion P1, and PMOS transistors M7 and M8 are used in second oscillator portion P2. Current sources CS2 and CS3 are connected on the side closer to positive power supply node VCC than to node VSS. Inductors L1, L2, L3, and L4 may be connected closer to node VSS than to positive power supply node VCC. Similarly, transmission line T3 having a length equal to $\lambda/2$ is coupled between $2^{nd}$ harmonic nodes A1 and A2. First oscillator portion P1 and second oscillator portion P2 are also marked. The operation of the QVCO circuit as shown in FIG. 3 is similar to the QVCO circuit as shown in FIG. 1, with nodes D1, D2, D3, and D4 being the quadrature nodes, and nodes A1 and A2 being the respective $2^{nd}$ harmonic nodes.

FIG. 4A illustrates a QVCO circuit in accordance with an alternative embodiment. In this embodiment, complementary transistors including NMOS transistors M1 through M4 and PMOS transistors M5 through M8 are used, with NMOS transistors M1 and M2 and PMOS transistors M5 and M6 being in first oscillator portion P1, and NMOS transistors M3 and M4 and PMOS transistors M7 and M8 being in second oscillator portion P2. Inductors L5 and L6 are coupled in parallel with capacitors C1 and C2, respectively. MOS transistors M5 and M6, which are cross-coupled to each other, are added into first oscillator portion P1. MOS transistors M7 and M8, which are cross-coupled to each other, are added into second oscillator portion P2. Similarly, transmission line T3 having a length equal to $\lambda/2$ is coupled between $2^{nd}$ harmonic nodes A1 and A2. FIG. 4B illustrates a QVCO circuit that is similar to the QVCO circuit shown in FIG. 4A, except that transmission line T3 in FIG. 4A is closer to node VSS than to node VCC, while transmission line T3 in FIG. 4B is closer to node VCC than to node VSS. The operation of the QVCO circuits shown in FIGS. 4A and 4B are similar to the QVCO circuit shown in FIG. 2, with nodes D1, D2, D3, and D4 being the quadrature nodes, and nodes A1 and A2 being the respective $2^{nd}$ harmonic nodes.

Figure 5:
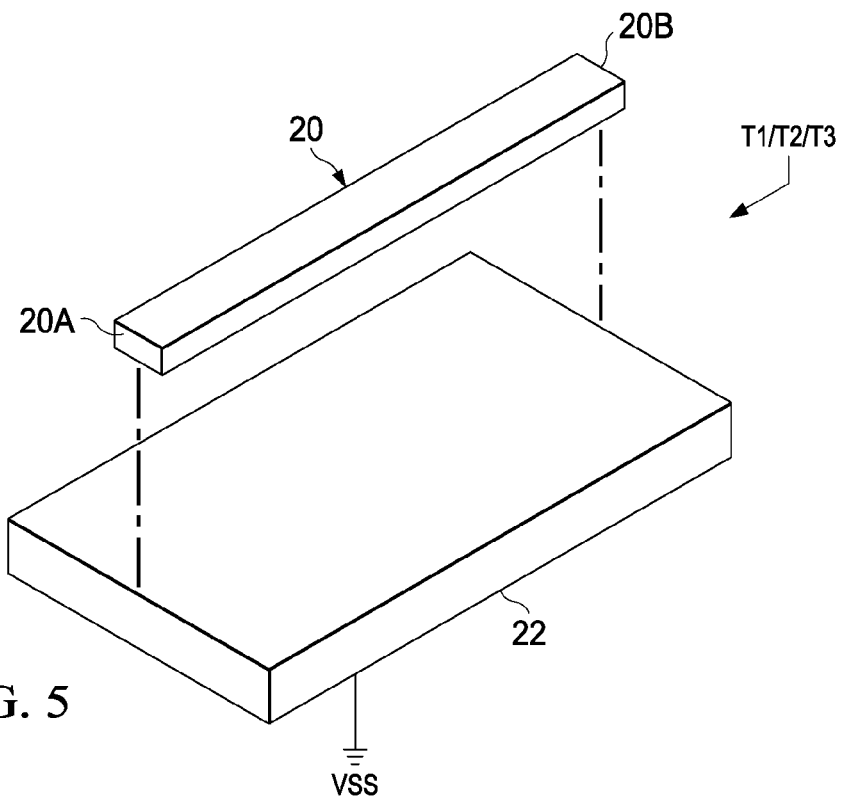
FIG. 5 illustrates a perspective view of a microstrip, which is an exemplary transmission line as shown in FIGS. 1 through 4B.

Transmission lines T1, T2, and T3 as shown in FIGS. 1 through 4B may be implemented using a plurality of known transmission lines, including, but not limited to, microstrips, grounded co-planar waveguides (GCPW), co-planar strips (CPS), grounded co-planar strips (GCPS), strip-lines, co-planar waveguides (CPW), slot-lines, coupled strip-lines, coupled micro-strip-lines, and the like. FIG. 5 illustrates microstrip line T1/T2/T3 that can be used as transmission lines T1, T2, and T3. Microstrip line T1/T2/T3 includes signal line 20 and grounded shield 22, which may shield noise to and from the underlying substrate (not shown). Signal line 20 and grounded shield 22 are formed of conductive materials such as metals (copper, for example). Dielectric materials (not shown) are disposed to separate signal line 20 from grounded shield 22. Grounded shield 22 may be formed between signal line 20 and the respective underlying substrate (not shown).

Figure 6:
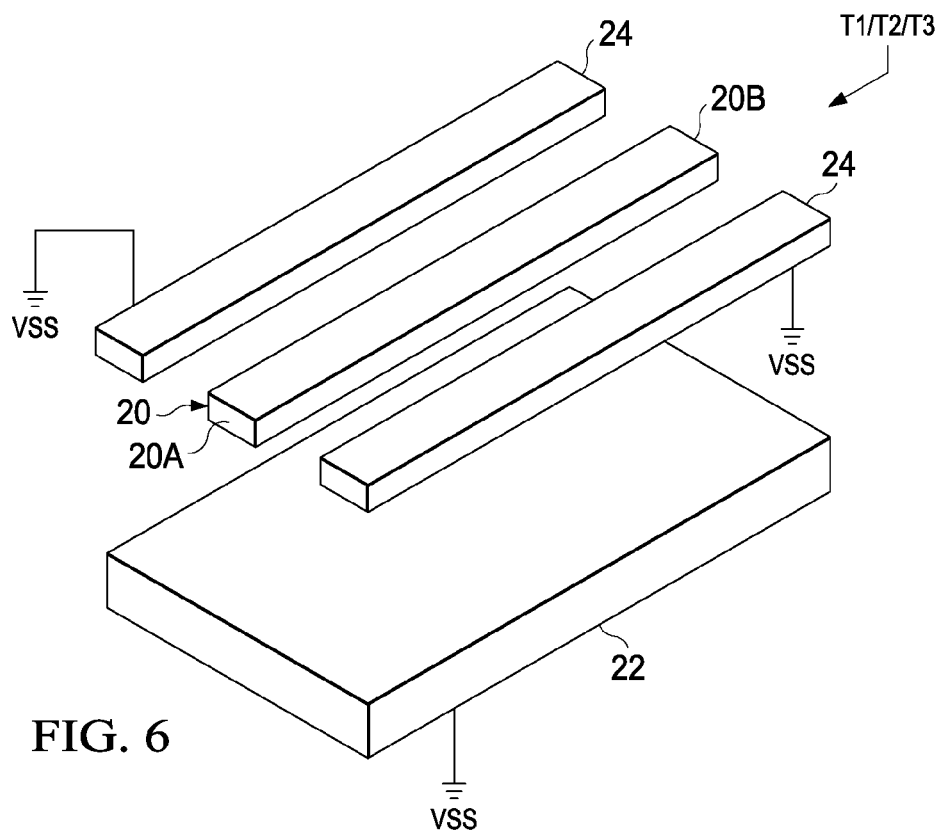
FIG. 6 illustrates a perspective view of a grounded co-planar waveguide, which is an exemplary transmission line as shown in FIGS. 1 through 4B.

FIG. 6 illustrates a GCPW (also denoted as T1/T2/T3) that can be used to implement transmission lines T1, T2, and T3 as shown in FIGS. 1 through 4B. GCPW T1/T2/T3, besides signal line 20 and grounded shield 22, also includes grounded strips 24 disposed on opposite sides of signal line 20. Signal line 20 and grounded strips 24 may be in a same plane that is parallel to grounded shield 22. In each of the transmission lines as shown in FIGS. 5 and 6, ends 20A and 20B of signal line 20 may be connected to $2^{nd}$ harmonic nodes A1 and A2 or to node A3 as shown in FIGS. 1 through 4B, depending on which embodiment is used. It is appreciated that transmission lines may have various other implementations, which may also be used in the embodiments of the present disclosure.

Figure 7:
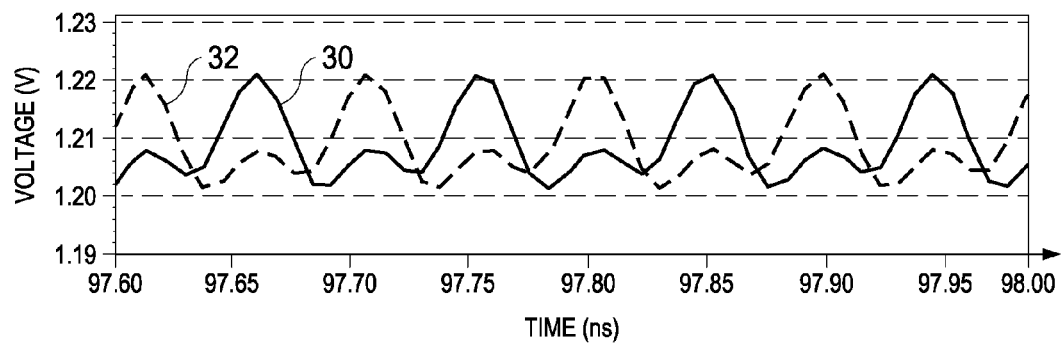
FIG. 7 illustrates waveforms of simulated $2^{nd}$ harmonic signals on $2^{nd}$ harmonic nodes in the QVCO circuit.

FIG. 7 illustrates the simulation results obtained from the QVCO circuits as shown in FIGS. 1 through 4B. Line 30 is the waveform of the $2^{nd}$ harmonic signal on $2^{nd}$ harmonic node A1, and line 32 is the waveform of the $2^{nd}$ harmonic signal on $2^{nd}$ harmonic node A2. It is observed that $2^{nd}$ harmonic signals on nodes A1 and A2 are differential signals with a phase difference equal to 180 degrees.

Figure 8:
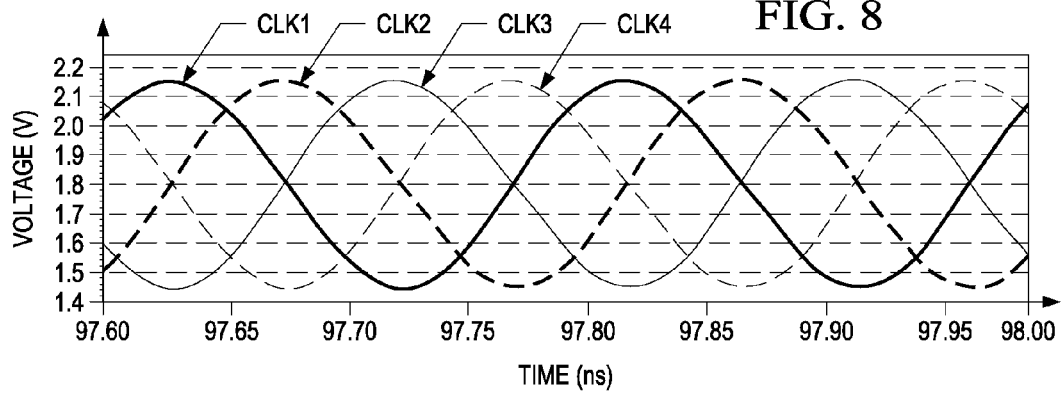
FIG. 8 illustrates waveforms of simulated quadrature signals on quadrature nodes in the QVCO circuit.

FIG. 8 also illustrates the simulation results obtained from the circuits shown in FIGS. 1 through 4B, wherein lines clk1, clk2, clk3, and clk4 are the waveforms of the quadrature signals obtained from quadrature nodes D1, D2, D3, and D4 (FIGS. 1 through 4B), respectively. It is observed that the quadrature signals have phase difference equal to the multiplication of 90 degrees.

The embodiments, by using transmission lines to couple differential $2^{nd}$ harmonic nodes A1 and A2, have improved gains. Simulation results have shown that at the frequency of 70 GHz, the S21 parameters of the QVCO circuits adopting transmission lines are higher than the conventional QVCO circuits adopting inductors by about 1 dB. Furthermore, Experiment results on silicon wafer have shown that the resonance frequencies of the embodiments are higher than that of the conventional QVCO circuits adopting inductors, capacitors, or transformers. The phase noises of the embodiments, which phase noises are measured at 1 MHz, are also lower compared to the phase noises obtained from the conventional QVCOs adopting inductors, capacitors, or transformers.

In accordance with embodiments, a circuit includes an oscillator circuit including a first oscillator and a second oscillator. The first and the second oscillators are configured to generate signals having a same frequency and different phases. A transmission line is coupled between the first and the second oscillators.

In accordance with other embodiments, a QVCO circuit includes a first oscillator and a second oscillator. The first oscillator has a first quadrature node and a second quadrature node, and a first harmonic node. The first oscillator is configured to generate oscillating signals having a first frequency on the first and the second quadrature nodes, and a first harmonic signal on the first harmonic node, wherein the first harmonic signal has a second frequency twice the first frequency. The second oscillator includes a third quadrature node and a fourth quadrature node, and a second harmonic node, wherein the second oscillator is configured to generate oscillating signals having the first frequency on the third and the fourth quadrature nodes, and a second harmonic signal having the second frequency on the second harmonic node. A transmission line is connected to the first harmonic node and coupled to the second harmonic node.

In accordance with yet other embodiments, an oscillator circuit includes a first oscillator having a first node; and a second oscillator having a second node. The first and the second oscillators are substantially identical to each other, wherein the oscillator circuit is configured to generate a first signal on the first node, and a second signal on the second node, with the first and the second signals having a same frequency, and a phase difference of 180 degrees. At least one serially connected transmission line has a first end connected to the first node, and a second end connected to the second node. A current source is connected between the at least one transmission line and a VSS node.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit comprising:
   an oscillator circuit comprising a first oscillator and a second oscillator, wherein the first and the second oscillators are configured to generate signals having a same frequency and different phases; and
   a first transmission line coupled between the first and the second oscillators, wherein the first transmission line comprises a first end connected to a first harmonic node of the first oscillator, and a second end connected to a second harmonic node of the second oscillator, with the first and the second harmonic nodes have a phase difference equal to about 180 degrees, and wherein the length of the first transmission line is equal to a half of a wavelength of harmonic signals generated on the first and the second harmonic nodes.

2. The circuit of claim 1 further comprising a first current source coupling the first harmonic node to a VSS node, and a second current source coupling the second harmonic node to the VSS node.

3. The circuit of claim 1, wherein the first transmission line comprises the first end connected to a first harmonic node of the first oscillator, and wherein the oscillator circuit further comprises:
   a second transmission line having a first end connected to the second harmonic node of the second oscillator, wherein each of the first and the second transmission lines comprises a second end connected to each other; and
   a current source coupling the second ends of the first and the second transmission lines to a VSS node.

4. The circuit of claim 1, wherein the first oscillator comprises a first quadrature node and a second quadrature node, the second oscillator comprises a third quadrature node and a fourth quadrature node, and wherein the oscillator circuit is configured to generate quadrature signals having a same frequency on the first, the second, the third, and the fourth quadrature nodes.

5. The circuit of claim 1, wherein each of the first and the second oscillators comprises:
   a first inductor and a second inductor;
   a capacitor comprising two ends, each connected to one of the first and the second inductors;
   a first MOS transistor comprising a gate connected to the second inductor, and a source connected to the first transmission line; and
   a second MOS transistor comprising a gate connected to the first inductor, and a source coupled to the first transmission line.

6. The circuit of claim 1, wherein the first transmission line is selected from the group consisting essentially of a microstrip, a grounded co-planar waveguide (GCPW), a co-planar strip (CPS), a grounded co-planar strip (GCPS), a strip lines, a co-planar waveguide (CPW), a slot-line, a coupled strip-line, and a coupled micro-strip-line.

7. A circuit comprising:
   a quadrature voltage controlled oscillator (QVCO) circuit comprising:

a first oscillator comprising a first quadrature node and a second quadrature node, and a first harmonic node, wherein the first oscillator is configured to generate oscillating signals having a first frequency on the first and the second quadrature nodes, and a first harmonic signal on the first harmonic node, and wherein the first harmonic signal has a second frequency twice the first frequency;

a second oscillator comprising a third quadrature node and a fourth quadrature node, and a second harmonic node, wherein the second oscillator is configured to generate oscillating signals having the first frequency on the third and the fourth quadrature nodes, and a second harmonic signal having the second frequency on the second harmonic node; and a first transmission line connected to the first harmonic node and coupled to the second harmonic node, wherein the first transmission line has a length equal to one fourth or a half of a wavelength of the first and the second harmonic signals.

8. The circuit of claim 7, wherein the length of the first transmission line is equal to one fourth of the wavelength of the first and the second harmonic signals, and wherein the QVCO circuit further comprises a second transmission line connected to the second harmonic node and the first transmission line.

9. The circuit of claim 8 further comprising a current source connected to an intermediate node between the first and the second transmission lines, wherein the current source is coupled between the intermediate node and a VSS node.

10. The circuit of claim 7, wherein the first transmission line has a length equal to a half of the wavelength of the first and the second harmonic signals, and wherein the first transmission line is further connected to the second harmonic node.

11. The circuit of claim 10, wherein the QVCO circuit further comprises:

a first current source connecting the first harmonic node to a VSS node; and a second current source connecting the second harmonic node to the VSS node.

12. The circuit of claim 7, wherein the first transmission line is selected from the group consisting essentially of a microstrip, a grounded co-planar waveguide (GCPW), a co-planar strip (CPS), a grounded co-planar strip (GCPS), a strip lines, a co-planar waveguide (CPW), a slot-line, a coupled strip-line, and a coupled micro-strip-line.

13. A circuit comprising:

an oscillator circuit comprising:

a first oscillator comprising a first node;

a second oscillator comprising a second node, wherein the first and the second oscillators are substantially identical to each other, and wherein the oscillator circuit is configured to generate a first signal on the first node, and a second signal on the second node, with the first and the second signals having a same frequency, and a phase difference of 180 degrees;

a transmission line having a length equal to a half of a wavelength of the first and the second signals, with a first end of the transmission line connected to the first node, and a second end of the transmission line connected to the second node; and a current source connected between the transmission line and a VSS node.

14. The circuit of claim 13, wherein transmission line consists of two separate transmission lines, each having a length equal to a fourth of a wavelength of the first and the second signals.

* * * * *